United States Patent
Sekihara (10) Patent No.: US 9,395,634 B2
(45) Date of Patent: Jul. 19, 2016

(54) PELLICLE FRAME AND PELLICLE WITH THIS

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 247 days.

(21) Appl. No.: 14/169,283

(22) Filed: Jan. 31, 2014

(65) Prior Publication Data

US 2014/0307237 A1    Oct. 16, 2014

(30) Foreign Application Priority Data

Apr. 15, 2013    (JP) .................................. 2013-84498

(51) Int. Cl.
| | | |
|---|---|---|
| G03F 1/64 | (2012.01) | |
| G03F 1/62 | (2012.01) | |
| G03F 7/20 | (2006.01) | |
| C23C 4/08 | (2016.01) | |
| C23C 4/18 | (2006.01) | |
| C23C 28/00 | (2006.01) | |

(52) U.S. Cl.
CPC .............. *G03F 7/70916* (2013.01); *C23C 4/08* (2013.01); *C23C 4/18* (2013.01); *C23C 28/00* (2013.01); *G03F 1/64* (2013.01)

(58) Field of Classification Search
CPC ...................................... G03F 1/64; G03F 1/62
See application file for complete search history.

(56) References Cited

U.S. PATENT DOCUMENTS

2010/0273097 A1*  10/2010  Shirasaki .................. G03F 1/64
                                                                              430/5
2011/0063601 A1*  3/2011  Kim ........................ C25D 11/04
                                                                              355/75

FOREIGN PATENT DOCUMENTS

| JP | 3777987 B2 | 5/2006 |
| JP | 2007-333910 A | 12/2007 |
| JP | 4605305 B2 | 1/2011 |

OTHER PUBLICATIONS

Extended European Search Report dated Jul. 8, 2014, issued in counterpart European Patent Application No. 14152984.2 (5 pages).
Extended European Search Report dated Nov. 17, 2014, issued in counterpart European Patent Application No. 14172079.7 (6 pages).

* cited by examiner

*Primary Examiner* — Stephen Rosasco
(74) *Attorney, Agent, or Firm* — Westerman, Hattori, Daniels & Adrian, LLP (57) ABSTRACT

A pellicle is proposed in which the frame is made of an aluminum alloy and at least the inner wall of the frame is entirely coated with a pure aluminum layer, which preferably has a purity of 99.7% or higher and a thickness of 3 through 50 micrometers; the pellicle frame with the pure aluminum layer may be subjected to anodic oxidation treatment, electric coloring, and void filling, and a resin layer can be formed as the outermost layer.

10 Claims, 6 Drawing Sheets

PELLICLE FRAME AND PELLICLE WITH THIS

The present non-provisional patent application claims priority, as per Paris Convention, from Japanese Patent Application No. 2013-84498 filed on Apr. 15, 2013, the disclosure of which is hereby incorporated by reference herein in its entirety.

FIELD OF THE INVENTION

The present invention relates to a pellicle useful as a dust-fender employed in the scenes of manufacturing semiconductor devices, printed circuit boards, liquid crystal display panels, organic EL display panels, etc.

BACKGROUND TECHNOLOGY

In manufacturing semiconductor devices such as LSI and super-LSI or in manufacturing a liquid crystal display panel or the like, a pattern is made by irradiating a light to a semiconductor wafer or a glass plate for liquid crystal, but if a dust particle is sticking to a photomask or a reticle (hereinafter merely referred to as "photomask") used in this stage, the particle absorbs the light or bends it, causing deformation of the pattern being transferred, edge blurring, or blackening of the base plate, and such phenomena lead to lowering of the precision of the size, grade and appearance of the end products.

Thus, these works are usually performed in a clean room, but, even in a clean room, it is yet difficult to keep the photomask clean all the time; hence, in practice, the light irradiation is conducted only after a surface of the photomask is sheltered by a pellicle as a dust fender. Under such circumstances, foreign particles do not directly adhere to the surface of the photomask, but only onto the pellicle membrane, and thus by setting a photo focus on a lithography pattern on the photomask, the foreign particles on the pellicle membrane fail to transfer their shadows onto the photomask and thus no longer become a problem to the image transfer performance.

In general, a pellicle is built up of a pellicle frame, which is an endless frame bar usually made of aluminum, a stainless steel, or the like, and a transparent pellicle membrane usually made of cellulose nitrate, cellulose acetate, a fluorine-containing polymer or the like which transmit light well; this pellicle membrane is attached via dried solution or adhesive to one of the two annular faces (hereinafter referred to as "upper annular face") of the pellicle frame. On the other one of the two annular faces of the frame (hereinafter referred to as "lower annular face") is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

A pellicle thus constructed is subjected to a foreign material inspection in a dark room with a focus lamp, so as to assure that the pellicle is used free of the effect of foreign particles. This inspection is conducted with respect to not only the pellicle membrane but also the inner wall of the pellicle frame. A foreign material stuck on the inner wall of the pellicle from is liable to fall on the mask surface so that, in general, this inspection is conducted in a darkroom using an irradiation of a light having a high illumination intensity such as one created by focus lamp, and the inspection is made by eye, and when a foreign material exists on the pellicle frame it is observed as an illuminating point. However, the surface of the pellicle frame has microscopic irregularities, which reflect light so that adding this an observer may see numerous illuminating points. On account of this it is customary that an observer compares by eye the size of an illuminating point with a certain threshold size to determine whether or not the illuminating point is a foreign material to render the pellicle unacceptable.

Now, in the case wherein the inner wall of the pellicle frame is coated with an agglutinant layer, even if a foreign material is stuck on the inner wall, the possibility that the foreign material falls is very low, so that the size of the foreign material that renders the pellicle unacceptable becomes larger such as several tens of micrometers; however, in recent years, it is becoming less common to provide agglutinant layer to the inner wall of the pellicle frame in fear that the agglutinant layer undergoes degradation and emits gas as a result of being attacked by stray lights during the light exposure operation, and thus even a very small foreign material such as the size of several micrometers would, when detected, render the pellicle unacceptable, and thus the rate of defective pellicle has been increased pellicles would increase.

However, in this stringent inspection, there are no small number of instances wherein a defective point in the alumite (anodic oxide coating) layer covering the pellicle frame is mistaken for a foreign material stuck on the pellicle frame. A pellicle frame commonly used is made of an aluminum alloy and its surface is provided with a black alumite treatment, and if a large crystalline particle (intermetallic compound) is formed in the surface, that portion of the surface fails to support a formation of a normal anodic oxide layer but tends to form a void or a white spot instead of being colored in black.

There have been trials made in order to prevent this phenomenon, and among them there are teachings according to IP Publications 1 and 2, in which the impurities in the aluminum alloy are reduced so as to minimize the size of the crystallization. However, various elements are included as supplemental ingredients in the aluminum alloy so that it is very difficult to completely do away with defects (light reflective points) that result from such alloy ingredients.

On the other hand, according to the teaching of IP Publication 3, in consideration of a fact that the surface of the alumite layer is porous and as such it tends to create dust particles, a resin coating is laid over the surface of the pellicle frame so as to suppress dust creation; however, in this method the resin coating imparts a modicum of gloss to the surface of the pellicle frame with a result that a defect (light reflective point) in the surface becomes more remarkable and invites a mistaken inspection.

Therefore, the fact remains that no pellicle frame and thus no pellicle have been realized which have such a high surface quality that there is no defect (light reflective point) that is liable to be mistaken for a foreign material. Accordingly, it has been necessary to spend a very long time to finish the inspection of the inner wall of the pellicle frame for foreign materials, and such time-consuming inspection for foreign materials has posed problems not only in cost but also in reliability of the products because of the high possibility of defective inspection in terms of mistaken identification and overlooking.

LIST OF PRIOR ART PUBLICATIONS

IP Publications

[IP Publication 1] Japanese Patent No 3777987
[IP Publication 2] Japanese Patent No. 4605305

[IP Publication 3] Japanese Patent Application Publication No. 2007-333910

BRIEF DESCRIPTION OF THE INVENTION

Problems the Invention Seeks to Solve

The present invention was contrived in view of the above-mentioned problems, and it is an object of the invention to provide a pellicle frame as well as a pellicle including said frame which has such a high quality in appearance and reliability that no light reflective points (defectives) exist in the inner wall of the frame which may cause mistaken identification as a foreign material such as a void and a white spot and which.

The present inventor conducted a strenuous research in order to attain the above-stated object, and in view of the fact that, if there are no small number of crystalline particles in the surface of or in the vicinities of the surface of the pellicle frame made of an aluminum alloy, the anodic oxide layer is not properly formed in the vicinities of the crystalline particles so that it becomes easy for a shape defect such as void to form in such areas, and that this kind of shape defect is a cause for the creation of the surface defect (light reflective point), the present inventor found that if the surface of or the vicinity of the surface of the pellicle frame which has such shape defect are covered with a high-purity aluminum layer having scarce crystalline particles, the inspection of the inner wall is not affected by the crystalline particles originating from the aluminum alloy or the shape defects caused by such crystalline particles, and thus he possessed the present invention.

Means to Solve the Problem

Therefore, the present invention is characteristic in that in a pellicle frame made of an aluminum alloy having an upper and a lower annular faces, and an outer wall and an inner wall, a substantially pure aluminum layer is formed on at least the inner wall of the pellicle frame. It is preferable that the purity of the aluminum layer is 99.7% or higher, and the surface roughness Ra is 0.5-5 micrometers, and it is also preferable that the surface of the pure aluminum layer is smoothed by polishing.

Furthermore, it is preferable that the thickness of the pure aluminum layer is from 3 micrometers through 50 micrometers, and such pure aluminum layer may be formed by thermal spraying or vapor deposition. It is more preferable that after the laying of the pure aluminum layer, anodic oxidation treatment, coloring such as electric coloring, or void filling are conducted, and it is possible to form, after the void filling, a resin layer on the inner wall, and this resin layer is preferably made of an acrylic resin, a polyester resin, a silicone resin, or a fluorine-containing resin.

Effects of the Invention

According to the present invention, by providing a pure aluminum layer on the inner wall of the pellicle frame, it is possible to significantly reduce the number of defects (light reflective points) that may be mistaken for foreign particles stuck on the inner wall of the pellicle frame, so that the time consumed by the inspection is shortened and it is possible to obtain a pellicle with a frame that has a quality appearance and high reliability.

EXAMPLES TO EMBODY THE PRESENT INVENTION

We will now explain examples of how the present invention is embodied, but the scope of the present invention shall not be construed any way limited by these examples.

Figure 1:
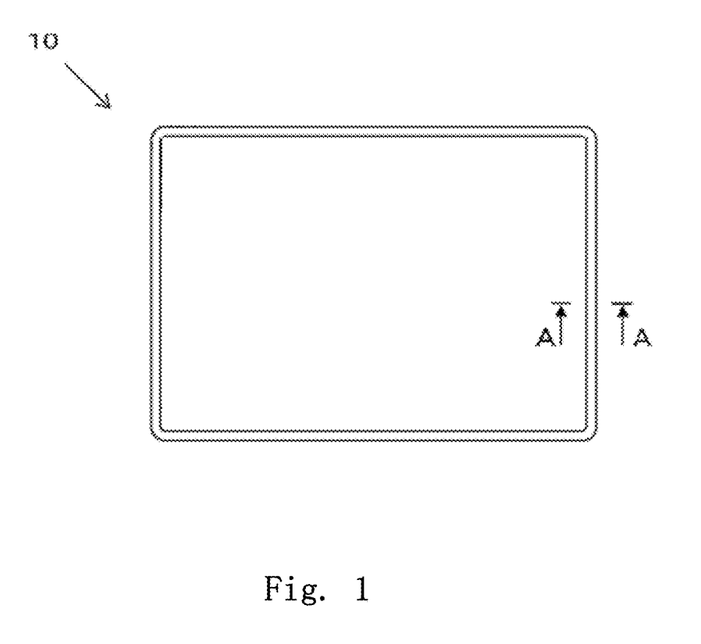
FIG. 1 is a top plan view of a pellicle frame representing one embodiment of the present invention.
Figure 2:
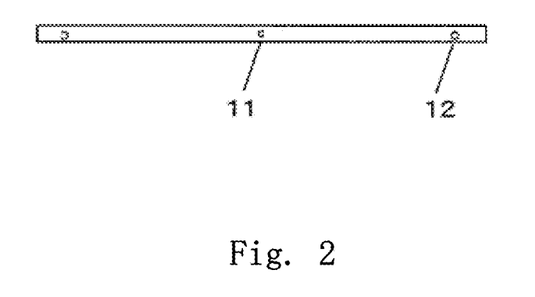
FIG. 2 is a front view of a pellicle frame representing one embodiment of the present invention.
Figure 3:
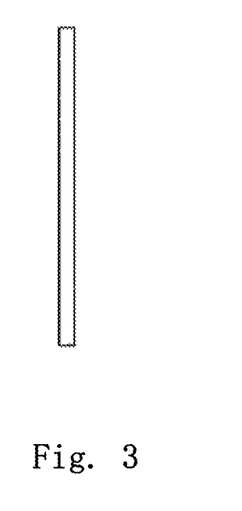
FIG. 3 is a right-side view of a pellicle frame representing one embodiment of the present invention.
Figure 4:
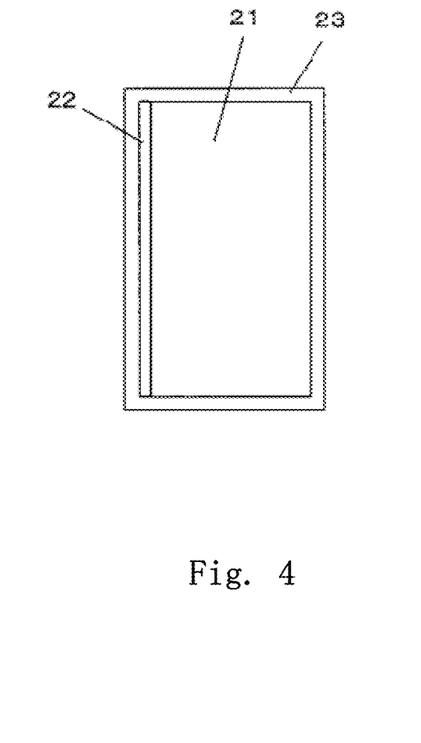
FIG. 4 is an enlarged cross section of a pellicle frame bar as cut by a plane indicated by A and A in FIG. 1.

FIG. 1 is a top plan view of a pellicle frame 10 representing one embodiment of the present invention, and FIG. 2 is a front view of the same, and FIG. 3 is a right-side view of the same, and FIG. 4 is an enlarged cross section of a pellicle frame bar as cut by a plane indicated by A and A in FIG. 1.

The pellicle frame 10 of the present invention is made through a machine tooling or a die casting of an aluminum alloy, and it may be formed with a vent hole 11 and a jig hole 12 for handling, etc. Also, in this pellicle frame 10 the inner wall of the aluminum alloy frame bar 21 is coated with a pure aluminum layer 22.

Now, this pure aluminum layer 22 is formed on the inner wall of the pellicle frame after the aluminum alloy plate is shaped in the pellicle frame, but it is possible to form the pure aluminum layer on the other faces of the pellicle frame. Also, it is possible to add as the outermost layer a so-called alumite layer 23, to which anodic oxidation treatment or coloring such as electric coloring treatment, or void filling treatment is conducted. It is preferable that before conducting the anodic oxidation treatment upon the pellicle frame, the pure aluminum layer 22 is subjected to a surface smoothening operation by mechanical polishing or chemical polishing, whereby occurrence of uneven appearance at the time of forming the pure aluminum layer 22 is reduced.

The aluminum alloy to make the frame bar 21 can be chosen from commercially available alloys such as JIS 7000 series, JIS 6000 series, 5000 series, 2000 series or a casting alloy, but the effect of the present invention will be more conspicuous if the frame bar 21 is made of an aluminum alloy which generates more crystalline particles (intermetallic compound).

Figure 5:
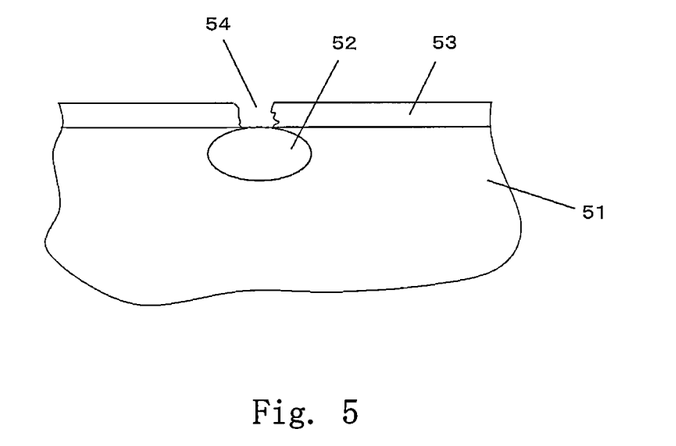
FIG. 5 is a cross section in the vicinity of an alumite layer in the case of a conventional pellicle frame.
Figure 6:
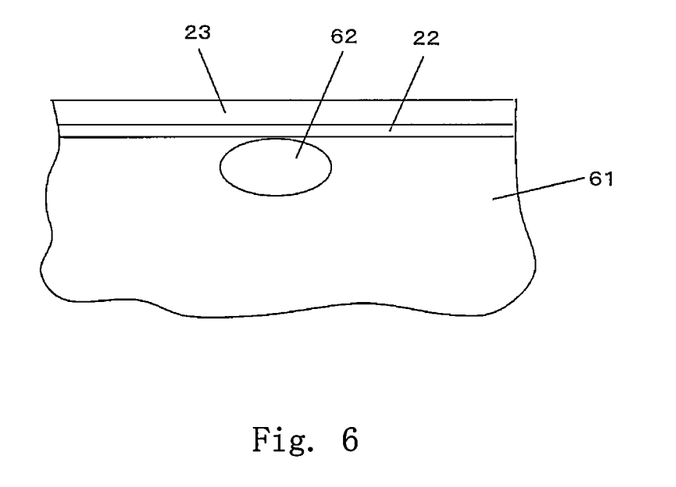
FIG. 6 is a cross section in the vicinity of an alumite layer in the case of a pellicle frame according to the present invention.

In FIG. 5 a surface defect (light reflective point) which can be mistaken for a foreign particle is shown, and a cause for this surface defect (light reflective point) is that if a crystalline particle 52 exists in the surface or in the vicinity of the surface of the pellicle frame 51 made of an aluminum alloy, the anodic oxide layer 53 does not tend to form properly over such spot but may form a shape defect 54 such as a void. In contrast to this, in the case of a pellicle frame of the present invention, as shown in FIG. 6, even if a crystalline particle 62 exists in the surface of the pellicle frame 61, the formation of the alumite layer 23 is not affected by the crystalline particle 62 at all thanks to the presence of the pure aluminum layer 22 over the surface of the pellicle frame 61. As a result, it is possible to obtain an alumite layer (anodic oxide layer) 23 which scarcely has the defects (light reflective points).

In the present invention, it is preferable that the pure aluminum layer 22 is formed over only the inner wall of the pellicle frame for the reason that it is not particularly necessary to be concerned about the crystalline particles in the outer wall, which faces a region of the photomask where lithographic pattern is not transferred, or about the crystalline particles in the upper and lower annular faces, which are respectively covered with the adhesive layer for adhering pellicle membrane and the agglutinant layer for adhering to photomask. It is preferable that this pure aluminum layer 22 is formed by means of thermal spraying or vapor deposition, and the purity of the aluminum layer 22 is 99.7% or higher and preferably it is 99.9% or higher. The higher the purity is the smaller the number of the surface defects created will be, and if the purity is less than 99.7%, the number of the crystalline particles will be not small enough.

In order to obtain a good anodic oxide layer 23, it is preferable that the thickness of the pure aluminum layer 22 is 3 micrometers through 50 micrometers; if less than 3 micrometers, there is a fear that the effect of the surface of the frame bar 21 is not suppressed enough by the later formed anodic oxide layer so that a defect is created, and if larger than 50 micrometers the time required to complete the formation of the pure aluminum layer becomes so long that the manufacturing cost becomes too high and the degradation in dimensional precision is feared too.

The surface roughness Ra of the pure aluminum layer 22 may preferably be 0.5-5 micrometers in order to prevent that the roughness of the surface of the pure aluminum layer 22 itself provides a defect (reflective point). If Ra is less than 0.5 micrometer, the surface becomes too smooth and glossy so that even an infinitesimal defect such as a scar becomes conspicuous and high reflection due to the glossiness may hinder a proper inspection. If Ra exceeds 5 micrometers, the surface becomes too sparkling to detect the targeted foreign particles, and thus not recommended. Also, before forming the anodic oxide layer, it is preferable to adjust the surface roughness by means of chemical polishing or sand blast treatment, and in such cases it is propitious to adjust the surface roughness Ra to about 1 micrometer or less.

The coloring and void filling treatment, following the forming of the anodic oxide layer, will complete the alumite layer 23, and from the viewpoint of light resistance it is possible to adopt the kind of electric coloring that separates Ni, Co, Cu, Sn, or Fe, in place of the coloring with a black organic pigment. Also, as the electrolytic solution used for forming the anodic oxide layer, it is possible to use an organic acid such as oxalic acid, tartaric acid, phosphoric acid or citric acid besides the commonly used sulfuric acid.

Figure 7:
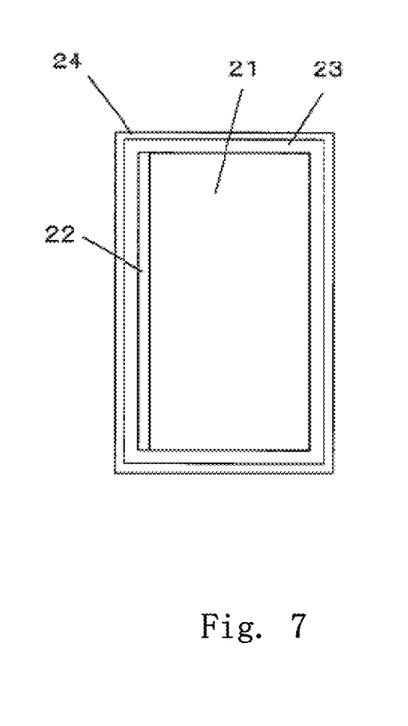
FIG. 7 is an enlarged cross section of a pellicle frame bar in the case of another embodiment of the present invention.

FIG. 7 shows another embodiment, and like FIG. 4 it is an enlarged cross section of a pellicle frame bar as cut by a plane indicated by A and A in FIG. 1. The basic construction of the pellicle frame is the same as in the previous embodiment, but in order to prevent dust from occurring from the infinitesimal irregularity of the surface of the alumite layer 23, a resin layer 24 is provided on the alumite layer 23. This resin layer 24 can be made of an epoxy resin, an amino acrylic resin, nylon resin, or the like, but especially from the viewpoints of light resistance, outgas amount, external appearance, handling and other considerations, it is preferable that the resin layer 24 is made of an acrylic resin, a polyester resin, a silicone resin, or a fluorine-containing resin.

If the underneath alumite layer 23 is of black color, it is not necessary that the resin layer 24 is black, and it can be transparent. Also, the inner wall and outer wall of the pellicle frame may be made of mutually different materials. In this case, it is possible that, after covering the entirety of the frame with the resin layer 24, another resin layer (not shown) is formed only on the inner wall of the frame; or it is also possible to cover the inner wall and the outer wall with different resins independently. In this case, it is especially preferred that the inner wall is covered with a kind of resin material having adhesiveness.

As the method for forming the resin layer 24, it is possible to adopt electrodeposition coating, spray coating, dipping or the like, and it is preferable if the operation environment is cleaned like a cleanroom and the coating liquid is filtered before the application of the resin layer.

Figure 8:
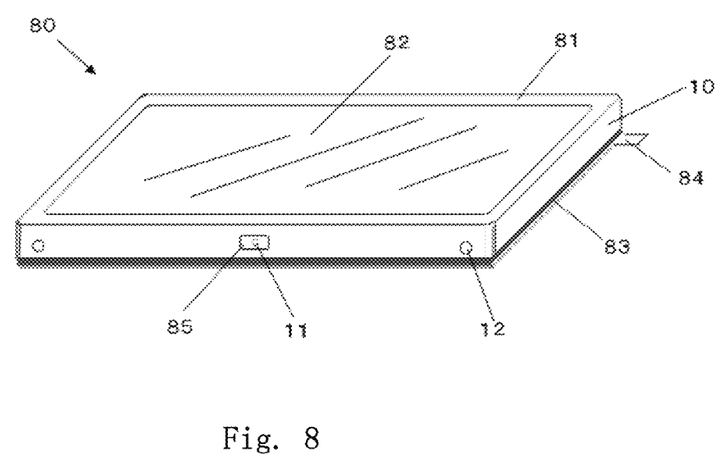
FIG. 8 is a perspective view of a pellicle made with a pellicle frame of the present invention.

FIG. 8 is a perspective view of a pellicle made with a pellicle frame of the present invention. A pellicle membrane 82 is adhered to the upper annular face of the pellicle frame 10 via an adhesive layer 81 in a manner such that the pellicle membrane 82 is tensed to an appropriate degree. On the lower annular face of the pellicle frame 10 is provided an agglutinant layer 83 for agglutination of the pellicle to a photomask, and the agglutinant layer 83 is covered with a protective separator 84. The pellicle frame 10 is formed with at least one vent hole 11, and a filter 85 is provided to cover this vent hole 11.

The pellicle frame 10 of the present invention is manufactured as described heretofore so that very few defects (light reflective points) in the frame surface are mistaken for foreign particles during the inspection, and the external appearance is of high quality, and when a pellicle is made with this pellicle frame 10, the inspection of the inner wall of the pellicle frame becomes easier and thus the inspection efficiency is improved, and it becomes possible to heighten the inspection precision with a result that the reliability is increased.

EXAMPLES

We will now explain examples of the present invention, and although these examples relate to small-sized pellicles, which are commonly used in the semiconductor-related applications, the applicability of this invention is not delimited by pellicle size.

Example 1

A rectangular pellicle frame 10 having an outward look as shown in FIG. 1 was made by machining. As shown in FIG. 2, two jig holes 12 were formed in the outer wall of each one of the longer-side pellicle frame bars for handling operation, and one penetrating vent hole 11 was made through each one of the longer-side pellicle frame bars. This pellicle frame 10 had an external dimension of 115 mm×149 mm, an internal dimension of 111 mm×145 mm and a height of 3.5 mm and the corners were curved such that the outer wall had a radius of 5 mm and the inner wall had a radius of 3 mm.

In Example 1a pellicle frame shown in FIG. 7 was made. The pellicle frame bar 21 was made of an aluminum alloy A7075, and a thermal treatment T651 was conducted on the frame bar 21, and a pure aluminum layer 22 having a thickness of 20 micrometers and a purity of 99.9% was applied to the inner wall of the pellicle frame bar 21 by oxy-fuel spraying. The surface roughness Ra of this pure aluminum layer was as high as 6-7 micrometers, and hence this surface was polished with grind stone and then with sand blast treatment with the result that the surface roughness Ra improved to 0.7-0.8 micrometers and the surface had a satin finish. Also, an alumite layer 23 was formed through anodic oxidation treatment, black coloring and void filling treatment. The frame was washed with water and was dried completely and then, a transparent acrylic resin layer 24 having a thickness of 5 micrometers was added to the thus prepared surface by electrodeposition coating.

Next, the thus prepared pellicle frame 10 was transported to a cleanroom, and it was washed with a surfactant and pure water, and then dried; the frame was then subjected to a foreign material inspection using a focus lamp in a dark room, and the result was that no surface defect (light reflecting point) that could have been mistaken for a foreign particle was detected and the external appearance was rated very good.

Example 2

A pellicle frame 10 having the same dimension as the pellicle frame 10 of Example 1 was made in the same manner except that the pure aluminum layer 22 was applied to the inner wall of the frame by vapor deposition method. The resultant pure aluminum layer 22 had a purity of 99.9% and a thickness of 3-4 micrometers; since the surface was smooth enough the grind polishing was omitted and only sand blasting was conducted to impart the satin finish to the surface, and thus an alumite layer 23 was formed. Thereafter, in the same manner as in Example 1, an acrylic resin layer 24 was formed as the outermost layer by electrodeposition coating.

Next, in the like manner as in Example 1, the pellicle frame 10 was inspected for foreign materials with a focus lamp, and the result was that no surface defect (light reflecting point) that could have been mistaken for a foreign particle was detected and the external appearance was rated very good.

Example 3

Using the same pellicle frame 10 of Example 1, a pellicle 80 as shown in FIG. 8 was manufactured. A fluorine-containing resin adhesive was applied to the upper annular face of the frame 10 as the adhesive layer 81, to which a pellicle membrane 82 made of a fluorine-containing resin was adhered in a tense and slack-free manner. Also, an acrylic agglutinant was applied to the lower annular face as the agglutinant layer 83 for bonding to a photomask, and a separator 84 which consists of a PTE film coated with a release agent was applied to the agglutinant layer 83 for protection thereof. Further, a filter 85 made of a PTFE membrane was glued in a vent hole 11 via an acrylic adhesive layer.

Next, the thus made pellicle 80 was evaluated in terms of its external appearance and was inspected for foreign materials with a focus lamp in a dark room, and the result was that there was no problem in the appearance of not only the inner wall but also the other faces of the pellicle frame 10, and as a whole the appearance of the frame was excellent. Also, since there were scarce number of surface defects (reflective points) in the inner wall of the pellicle frame which reflected light toward the pellicle membrane, the inspection was conducted very smoothly.

COMPARATIVE EXAMPLE

In this comparative example, a pellicle frame 10 having exactly the same dimension as the one of Example 1 was made using only the same aluminum alloy as that used in Example 1. Except that no pure aluminum layer 23 was provided to the inner wall of the pellicle frame, exactly the same procedures were taken as in Example 1 including the application of the same acrylic resin as in Example 1, as the outermost layer, by electrodeposition coating.

Next, the thus manufactured pellicle frame 10 was examined in the similar manner as in Example 1, and it was discovered that two points which were suspected to be foreign particles of a size of 40-50 micrometers were illuminating and five other points suspected to be foreign particles of a size of 10-20 micrometers were illuminating. Then, these defective points were inspected by microscope, and it was found that all of them were defects in the alumite layer rather than foreign particles, and that their presence were made more conspicuous through the electrodeposition coating layer at the surface.

REPRESENTATION OF REFERENCE NUMERALS

10: pellicle frame
11: vent hole
12: jig hole
21: frame bar
22: pure aluminum layer
23: alumite later
24: resin layer
51: aluminum alloy
52: crystalline particle
53: alumite layer
54: surface defect
61: aluminum alloy
62: crystalline particle
80: pellicle
81: pellicle membrane-bonding adhesive layer
82: pellicle membrane
83: photomask-bonding agglutinant layer
84: separator
85: filter Scopes of what is claimed:

1. A pellicle frame comprising: a pellicle frame body made of an aluminum alloy, and a pure aluminum layer coating on at least an inner wall of the pellicle frame body.

2. The pellicle frame as claimed in claim 1 wherein the purity of said pure aluminum layer is 99.7% or higher.

3. The pellicle frame as claimed in claim 1 wherein surface roughness Ra of said pure aluminum layer is 0.5-5 micrometers.

4. The pellicle frame as claimed in claim 1 wherein said pure aluminum layer is smoothed by polishing.

5. The pellicle frame as claimed in claim 1 wherein a thickness of said pure aluminum layer is 3 through 50 micrometers.

6. The pellicle frame as claimed in claim 1 wherein said pure aluminum layer is formed by means of a method selected from thermal spraying and vapor deposition.

7. The pellicle frame as claimed in claim 1 wherein after the formation of said pure aluminum layer, the pellicle frame is subjected to anodic oxidation treatment, coloring such as electric coloring, and void filling treatment.

8. The pellicle frame as claimed in claim 7 wherein after the void filling treatment a resin layer is formed as an outermost layer.

9. The pellicle frame as claimed in claim 8 wherein said resin layer is made of a material selected from an acrylic resin, a polyester resin, a silicone resin, and a fluorine-containing resin.

10. A pellicle made with a pellicle frame as described in claim 1.

* * * * *